United States Patent
Gu et al.

[11] Patent Number: 6,011,274
[45] Date of Patent: Jan. 4, 2000

[54] X-RAY IMAGER OR LCD WITH BUS LINES OVERLAPPED BY PIXEL ELECTRODES AND DUAL INSULATING LAYERS THEREBETWEEN

[75] Inventors: Tieer Gu; Willem den Boer, both of Troy, Mich.

[73] Assignee: OIS Optical Imaging Systems, Inc., Northville, Mich.

[21] Appl. No.: 08/954,471

[22] Filed: Oct. 20, 1997

[51] Int. Cl.[7] .......................... H01L 29/04; H01L 31/036; H01L 31/0376; H01L 31/20
[52] U.S. Cl. ............... 257/59; 257/72; 257/258; 257/443; 349/138
[58] Field of Search ................. 257/58, 72, 258, 257/443; 349/138

[56] References Cited

U.S. PATENT DOCUMENTS

| | | |
|---|---|---|
| 4,470,667 | 9/1984 | Okubo et al. . |
| 4,654,117 | 3/1987 | Aoki et al. . |
| 4,704,559 | 11/1987 | Suginoya et al. . |
| 4,980,002 | 12/1990 | Dzarnoski, Jr. et al. . |
| 4,994,434 | 2/1991 | Hung et al. . |
| 5,003,356 | 3/1991 | Wakai et al. . |
| 5,055,899 | 10/1991 | Wakai et al. . |
| 5,182,620 | 1/1993 | Shimada et al. . |
| 5,287,208 | 2/1994 | Shimoto et al. . |
| 5,302,987 | 4/1994 | Kanemori et al. . |
| 5,389,492 | 2/1995 | Kokubo et al. . |
| 5,414,278 | 5/1995 | Kobayashi et al. . |
| 5,414,283 | 5/1995 | den Boer et al. . |
| 5,414,547 | 5/1995 | Matsuo et al. . |
| 5,419,991 | 5/1995 | Segawa . |
| 5,422,293 | 6/1995 | Konya . |
| 5,426,523 | 6/1995 | Shimada et al. . |
| 5,446,562 | 8/1995 | Sato . |
| 5,453,857 | 9/1995 | Takahara . |
| 5,457,553 | 10/1995 | Mori . |
| 5,463,230 | 10/1995 | Negoto et al. . |
| 5,463,484 | 10/1995 | Brody . |
| 5,483,366 | 1/1996 | Atherton . |
| 5,528,209 | 6/1996 | MacDonald et al. . |
| 5,532,180 | 7/1996 | den Boer et al. . |
| 5,539,219 | 7/1996 | den Boer et al. . |
| 5,585,951 | 12/1996 | Noda et al. . |
| 5,641,974 | 6/1997 | den Boer et al. . |
| 5,650,358 | 7/1997 | Gu et al. . |
| 5,721,601 | 2/1998 | Yamaji et al. . |
| 5,780,871 | 7/1998 | den Boer et al. .......................... 257/59 |
| 5,818,550 | 10/1998 | Kadota et al. . |
| 5,920,084 | 7/1999 | Gu et al. . |

FOREIGN PATENT DOCUMENTS

| | | |
|---|---|---|
| 0603866 | 6/1994 | European Pat. Off. . |
| 0762184 | 3/1997 | European Pat. Off. . |
| 431826 | 2/1992 | Japan . |

OTHER PUBLICATIONS

"Benzocyclobutene Dielectric Resins for Flat Panel Display Applications" by Radler, et. al.
"Invited Address: High–Aperture TFT Array Structures" by Suzuki, SID 1994 Digest.

(List continued on next page.)

*Primary Examiner*—Mahshid Saadat
*Assistant Examiner*—Allan R. Wilson
*Attorney, Agent, or Firm*—Joseph A. Rhoa

[57] ABSTRACT

This invention is related to an active matrix liquid crystal display (AMLCD) or an X-ray imaging device having a high aperture ratio. The imager or display has an increased aperture ratio because electrodes are formed over dual insulating layers so as to overlap portions of the array address lines and/or TFTs. Both the manufacturability and capacitive crosstalk of the device are improved due to the use of a photo-imageable organic insulating layer between the pixel electrodes and the address lines. An intermediate inorganic insulating layer is provided between the photo-imageable organic insulating layer and the overlapped TFTs in order to prevent the organic insulating layer from directly contacting semiconductor material in the TFTs thereby reducing potential voltage swings.

19 Claims, 5 Drawing Sheets

OTHER PUBLICATIONS

"A 6.4–in.–Diagonal Color TFT–LCD Module Suitable for Personal Information Tools" by Takeda, et. al., SID 1994 Digest.

"A High–Aperture–Ratio TFT–LCD with a Shield–Electrode Structure" by Ueda, et. al., SID 1993 Digest.

"Optimisation of Very Small Pitch Active Matrix LCD for Projection" by Vignolle, et. al, IEEE, 1991.

"High–Aperture and Fault–Tolerant Pixel Structure for TFT–LCDs" by Kim, et. al., SID 1995 Digest.

"A High–Aperture–Ratio 3–in. Diagonal VGA a–Si Light Valve With Pixel/Data and Pixel/Gate Lines Overlapping" by Sakamoto, et. al., SID 1996 Digest.

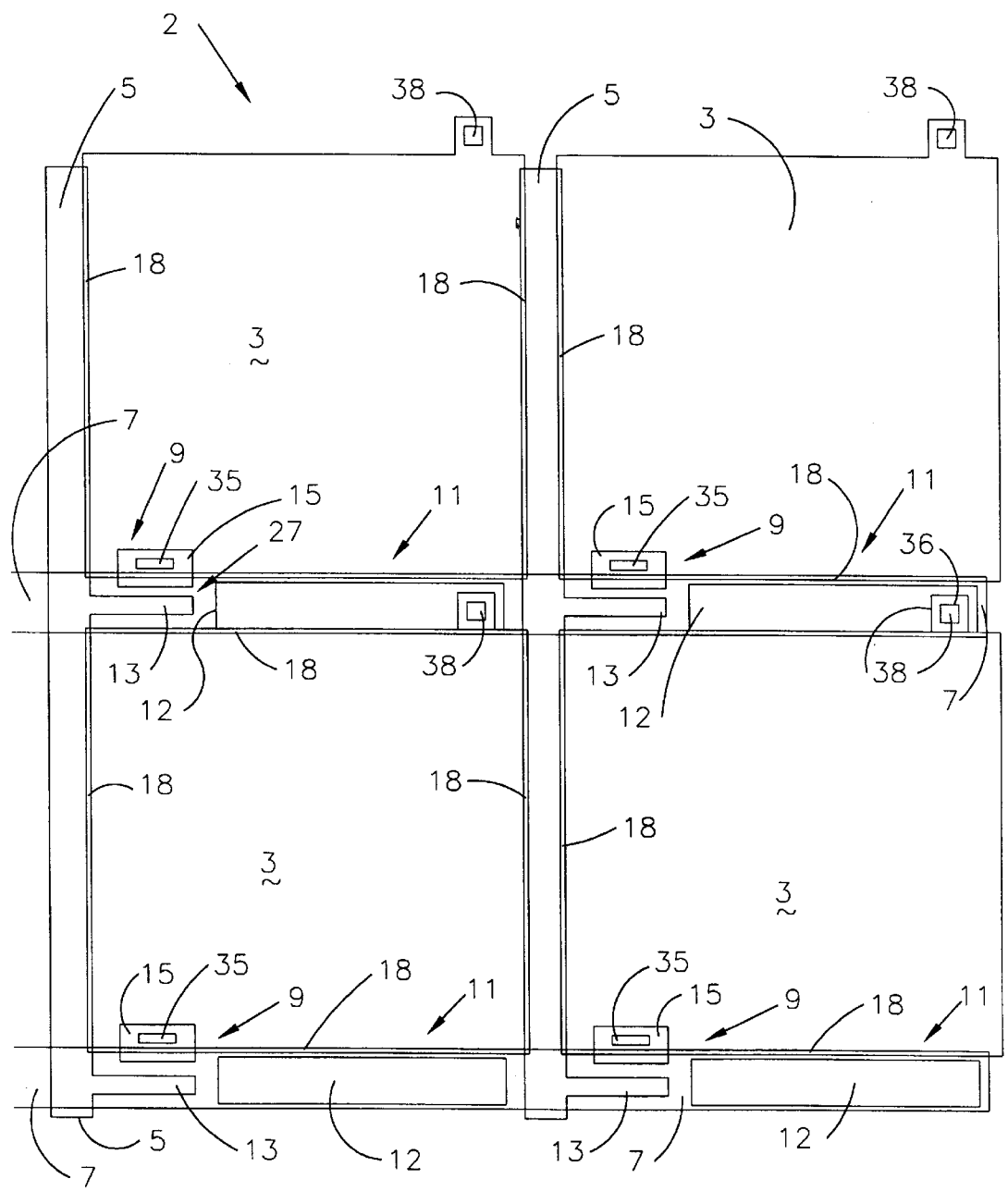

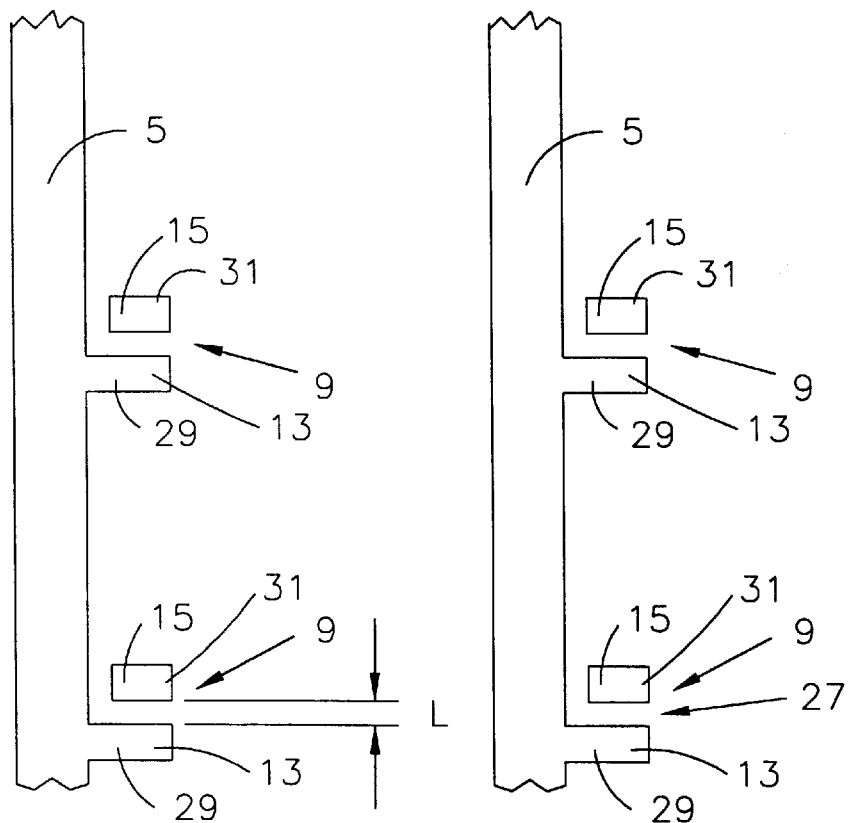
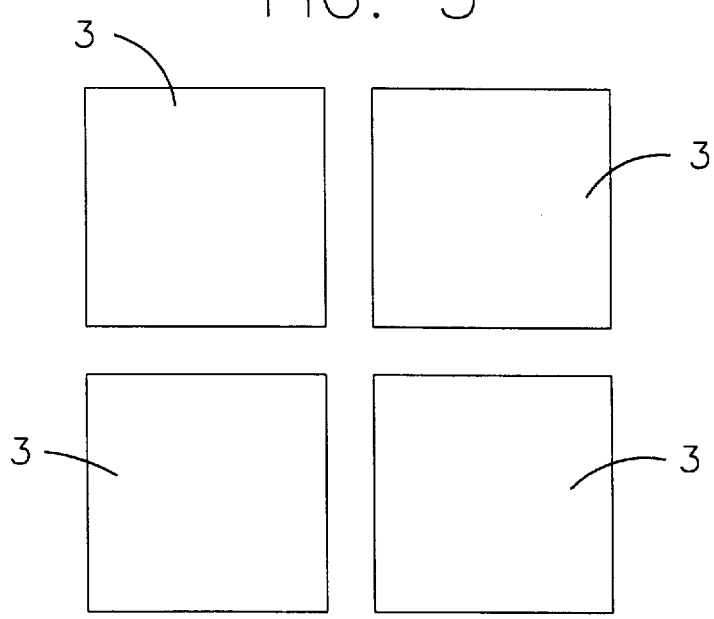

X-RAY IMAGER OR LCD WITH BUS LINES OVERLAPPED BY PIXEL ELECTRODES AND DUAL INSULATING LAYERS THEREBETWEEN

RELATED PATENTS AND APPLICATIONS

This application is related to commonly owned U.S. Pat. No. 5,641,974, and commonly owned Ser. Nos. 08/470,271; 08/832,345; 08/671,376; and 08/630,984, the disclosures of which are hereby incorporated herein by reference. Also, this application is related to an application filed simultaneously herewith, entitled METHOD OF MAKING X-RAY IMAGER OR LCD WITH BUS LINES OVERLAPPED BY PIXEL ELECTRODES AND DUAL INSULATING LAYERS THEREBETWEEN.

This invention relates to an X-ray imager or a liquid crystal display (LCD) having an increased pixel aperture ratio. More particularly, this invention relates to such an imager or liquid crystal display including an array of TFTs wherein a pair of insulating layers having a plurality of contact vias or apertures disposed therein are located between (i) the TFTs and/or address lines and (ii) overlapping electrodes so that the electrodes are permitted to overlap the row and column address lines and/or the TFTs without exposing the system to capacitive crosstalk.

BACKGROUND OF THE INVENTION

Electronic matrix arrays find considerable application in X-ray imagers and active matrix liquid crystal displays (AMLCDs). Such AMLCDs and X-ray imagers generally include X and Y (or row and column) address lines which are horizontally and vertically spaced apart and cross at an angle to one another thereby forming a plurality of crossover points. Associated with each crossover point is an element (e.g. pixel) to be selectively addressed. These elements in many instances are liquid crystal display pixels or alternatively the memory cells of an electronically adjustable memory array or X-ray imaging array.

Typically, a switching or isolation device such as a diode or thin film transistor (TFT) is associated with each array element or pixel. The isolation devices permit the individual pixels to be selectively addressed by the application of suitable potentials between respective pairs of the X and Y address lines. Thus, the TFTs act as switching elements for energizing or otherwise addressing corresponding pixel electrodes.

Amorphous silicon (a-Si) TFTs have found wide usage for isolation devices in liquid crystal display (LCD) arrays and X-ray imagers. Structurally, TFTs generally include substantially co-planar source and drain electrodes, a thin film semiconductor material (e.g. a-Si) disposed between the source and drain electrodes, and a gate electrode in proximity to the semiconductor but electrically insulated therefrom by a gate insulator. In LCDs, current flow through a TFT between the source and drain is controlled by the application of voltage to the gate electrode. The voltage to the gate electrode produces an electric field which accumulates a charged is region near the semiconductor-gate insulator interface. This charged region forms a current conducting channel in the semiconductor through which current is conducted. Thus, by controlling the voltage to the gate and drain electrodes, pixels may be switched on and off in a known manner.

Herein, "drain" electrodes are those which are in communication with a drain address line and "source" electrodes are those that are in communication with the pixel electrodes through vias in the insulating layers.

It is old and well-known to make TFT arrays wherein address lines and overlapping pixel electrodes are insulated from one another by an insulating layer. For example, see U.S. Pat. Nos. 5,641,974; 5,055,899; 5,182,620; 5,414,547; 5,426,523; 5,446,562; 5,453,857; and 5,457,553, the disclosures of which are incorporated herein by reference.

Unfortunately, when certain prior art pixel electrodes are arranged so as to overlap the address lines (e.g. U.S. Pat. No. 5,003,356), an undesirably high parasitic capacitance results in the overlap areas between the pixel electrodes and the address lines. In overlap areas, the pixel electrode forms a capacitor in combination with the overlapped address lines. The resulting parasitic capacitance $C_{PL}$ between the pixel electrode and the address line in the area of overlap is defined as follows:

$$C_{PL} = (\epsilon \cdot \epsilon_0 \cdot A) \div d$$

where "$\epsilon$" is the dielectric constant of the insulating layer, "$\epsilon_0$" is a constant value of about $8.85 \times 10^{-14}$ F/cm, "A" is the area of the resulting capacitor in the area of overlap, and "d" is the thickness of the insulating layer in the area of overlap.

When a thin profile silicon nitride insulator is used as in U.S. Pat. No. 5,003,356, the resulting parasitic capacitance created by the overlap is undesirably high thereby resulting in capacitive crosstalk in the LCD. The dielectric constant of silicon nitride is well over 5.0 (typically from about 6.4 to 7.2). Such crosstalk results when the signal voltage intended to be on a particular pixel is not there. Thus, when $C_{PL}$ is too high, the voltage on the pixel is either higher or lower than intended depending upon how much voltage the other pixels on the signal address line receive. In other words, the pixel is no longer satisfactorily isolated when $C_{PL}$ is too high. In view of the above, there exists a need in the art for an LCD (and/or X-ray imager) having both an increased aperture ratio as well as reduced capacitive crosstalk in overlap areas so as to simultaneously and properly isolate each pixel and increase the pixel opening sizes.

Further with respect to the '356 patent, for example, its disclosure does not appreciate the importance of the dielectric constant $\epsilon$ of the insulating layer. While referencing numerous materials including silicon nitride and $SiO_2$, which may be used for the insulating layer, the '356 patent does not discuss either the dielectric constant values of these materials or their importance in helping reduce $C_{PL}$ in overlap areas. When $\epsilon$ of the insulating layer is too high, capacitive crosstalk results.

Recently, organic polymer films have been applied to TFT-LCDs as an insulating layer between address lines and pixel electrodes in high aperture applications. For example, see commonly owned U.S. Pat. No. 5,641,974. There has been increasing concern as to how such polymers affect back-channel-etch TFT performance and reliability. It has been found that both threshold voltage and sub-threshold swing can be degraded by acrylic or black resin insulating layers, as compared to silicon nitride, for example. In addition, a high off-current shoulder in sub-threshold regions has been found after negative gate voltage stress on acrylic passivated TFTs. The mechanism behind such degradation is believed to be that fixed charge and defect states are created at the interface between the organic insulating layer and the a-Si TFT layer.

As the performance of LCDs and X-ray imagers is dependent upon TFT characteristics in both the off-state and sub-threshold regions, the below-referenced invention is an improvement over the disclosure of the commonly owned '974 patent in an effort to improve TFT characteristics and performance.

It is apparent from the above that there exists a need in the art for an improved TFT array and/or resulting LCD (or X-ray imager) having an increased pixel aperture ratio, good TFT performance in all regions, and little capacitive crosstalk. Such an LCD or X-ray imager should be made with as few steps as possible.

It is a purpose of this invention to fulfill the above-described needs in the art, as well as other needs which will become apparent to the skilled artisan from the following detailed description of this invention.

SUMMARY OF THE INVENTION

Generally speaking, this invention fulfills the above-described needs in the art by providing an X-ray imager comprising:

a substrate;

an array of thin film transistors (TFTs) disposed on the substrate, the array of TFTs including a plurality of address lines connected to the TFTs;

an array of substantially transparent electrodes disposed on the first substrate, a plurality of the electrodes in the array of electrodes overlapping at least one of the address lines;

an organic photo-imageable insulating layer having a dielectric constant less than about 4.0 disposed on the substrate between the address lines and the electrodes at least in areas of overlap and areas adjacent source electrodes of the TFTs;

an intermediate protective insulating layer disposed between the TFTs and the photo-imageable insulating layer so as to prevent the organic photo-imageable insulating layer from directly contacting semiconductor material in channels of the TFTs thereby reducing potential shifts of threshold voltage and subthreshold swings in the TFTs; and the photo-imageable insulating layer and the intermediate protective layer each having a plurality of contact vias defined therein, wherein the electrodes are in electrical communication with corresponding TFT source electrodes through the contact vias defined in the insulating layers.

In certain preferred embodiments, the organic photo-imageable insulating layer is a negative resist which includes BCB.

In certain preferred embodiments, the organic photo-imageable insulating layer has a dielectric constant of less than about 3.0.

In certain preferred embodiments, the organic photo-imageable insulating layer has a thickness of from about 0.9 $\mu$m to 2.75 $\mu$m, with the thickness in the areas of overlap, of course, being smaller than the above-recited thickness.

In certain preferred embodiments, the intermediate insulating layer has a thickness of from about 100 Å–1,000 Å.

This invention further fulfills the above-described needs in the art by providing a liquid crystal display comprising:

a first substrate;

a liquid crystal layer;

an array of substantially transparent pixel electrodes on the first substrate for permitting image data to be displayed to a viewer;

a plurality of gatelines and TFT gate electrodes on the first substrate;

a semiconductor layer patterned so as to remain in an array of TFT areas;

a source and drain electrode in each TFT area on the first substrate, a TFT channel being defined between a corresponding source and drain electrodes of each TFT, thereby forming an array of TFTs on the first substrate;

drain lines connected to the drain electrodes;

wherein a plurality of the pixel electrodes overlap at least one of a gateline and a drain line thereby increasing the pixel aperture ratio of the display;

a substantially transparent photo-imageable insulating layer having a dielectric constant less than about 4.0, the photo-imageable insulating layer being disposed on the first substrate between (i) the pixel electrodes and (ii) the TFTs and the overlapped lines so as to insulate the pixel electrodes from the overlapped lines and the TFTs; and an intermediate insulating layer disposed between the photo-imageable insulating layer and the TFTs so as to prevent the photo-imageable insulating layer from directly contacting TFT portions which the photo-imageable insulating layer overlap.

This invention further fulfills the above-described needs in the art by providing a TFT array structure comprising:

an array of TFTs on a substrate, the TFTs being connected to a corresponding array of electrodes;

row and column address lines on the substrate for addressing the TFTs;

organic photo-imageable insulating means having a dielectric constant less than about 4.0 disposed between the electrodes and the address lines so as to reduce crosstalk and permit the insulating means to be photo-imaged; and an intermediate protective insulating layer disposed between the photo-imageable insulating means and the TFTs so as to prevent the insulating means from contacting semiconductor material of the TFTs.

This invention will now be described with reference to certain embodiments thereof as illustrated in the following drawings.

IN THE DRAWINGS

FIG. 1 is a top view of an AMLCD according to this invention, this figure illustrating pixel electrodes overlapping surrounding row and column address lines along their respective lengths throughout the display's pixel area so as to increase the pixel aperture ratio of the display.

FIG. 2 is a top view of the column (or drain) address lines and corresponding drain electrodes of FIG. 1 (or of an X-ray imager), this figure also illustrating the TFT source electrodes disposed adjacent the drain electrodes so as to define the TFT channels having length "L."

FIG. 3 is a top view of the pixel electrodes of FIG. 1 (or of an X-ray imager) except for their extensions.

DETAILED DESCRIPTION OF CERTAIN EMBODIMENTS OF THIS INVENTION

Figure 4:
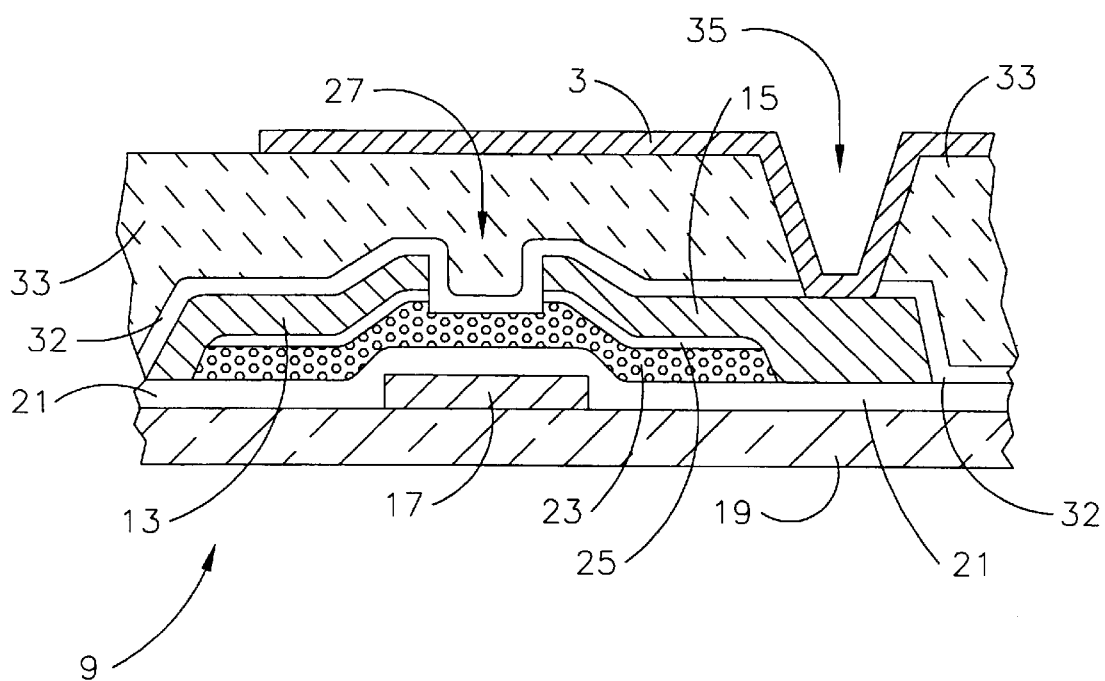
FIG. 4 is a side elevational cross-sectional view of the linear-shaped thin film transistors (TFTs) of FIGS. 1–2, this structure being utilized in either an LCD or an X-ray imager according to this invention.

Referring now more particularly to the accompanying drawings in which like reference numerals indicate like parts throughout the several views.

The structure and function of AMLCDs are disclosed in U.S. Pat. No. 5,641,974, and the structure and function of X-ray imagers are disclosed in U.S. Pat. Nos. 5,525,527; 5,498,880; 5,396,072; and 5,619,033, the disclosure of which are incorporated herein by reference. Familiarity with such structures and functions is assumed herein.

FIG. 1 is a top view of four pixels in an array of an active matrix liquid crystal display (AMLCD) 2 according to an embodiment of this invention. This portion of the display includes substantially transparent pixel electrodes 3, drain address lines 5, gate address lines 7, an array of four thin film transistors (TFTs) 9, and auxiliary storage capacitors 11 associated with each pixel. Each storage capacitor 11 is defined on one side by a gate line 7 and on the other side by an independent storage capacitor electrode 12. Storage capacitor electrodes 12 are formed along with drain electrodes 13. As shown, the longitudinally extending edges of each pixel electrode 3 overlap drain lines 5 and gate lines 7 respectively along the edges thereof so as to increase the pixel aperture ratio (or pixel opening size) of the LCD.

In the areas of overlap 18 between substantially transparent pixel electrodes 3 and address or bus lines 5, 7, a pixel-line (PL) capacitor is defined by an electrode 3 on one side and the overlapped address line on the other. The dielectric disposed between the electrodes of these PL capacitors is insulation layer 33 (see FIGS. 4 and 7). The parasitic capacitance $C_{PL}$ of these capacitors is defined by the equation:

$$C_{PL} = \frac{\epsilon \cdot \epsilon_0 \cdot A}{d}$$

where "d" is the thickness of layer 33, $\epsilon$ is the dielectric constant of layer 33, $\epsilon_0$ is the constant $8.85 \times 10^{-14}$ F/cm (permitivity in vacuum), and "A" is the area of the PL capacitor in overlap areas 18. The fringing capacitance may also be taken into consideration in a known manner. According to certain other embodiments, $C_{PL}$ is less than or equal to about 0.01 pF for a display with a pixel pitch of about 150 $\mu$m. When the pixel pitch is smaller, $C_{PL}$ should be scaled to a lower value as well because overlap areas 18 are smaller. Additionally, the pixel aperture ratio of an LCD decreases as the pixel pitch decreases as is known in the art. The pixel pitch of AMLCD 2 may be from about 40 to 5,000 $\mu$m according to certain embodiments of this invention. The pixel pitch as known in the art is the distance between centers of adjacent pixels in the array.

According to alternative embodiments of FIG. 1, the TFTs may be swung 90° so that the gates are formed by perpendicular extensions from the gate lines and the drains are formed by the drain lines themselves. This may be used in both LCD and X-ray imager embodiments of this invention.

FIG. 2 is a top view of drain address lines 5 of AMLCD 2 (or of an X-ray imager) showing how extensions of address lines 5 may form drain electrodes 13 of TFTs 9 in the FIG. 1 illustrated embodiment. Each TFT 9 in the array includes source electrode 15, 31. drain electrode 13, 29, and gate electrode 17. Gate electrode 17 of each TFT 9 is formed by the corresponding gate address line 7 in the FIG. 1 illustrated embodiment. According to other embodiments discussed above, the gate electrode 17 may be formed by a branch extending substantially perpendicular to the gate line, while drain electrodes 13 are formed by the drain lines 5 themselves.

FIG. 3 is a top view illustrating pixel electrodes 3 (absent their extension portions 38) of AMLCD 2 or an X-ray imager arranged in array form.

FIG. 4 is a side elevational cross-sectional view of a single thin film transistor (TFT) 9 in the TFT array of either an X-ray imager or AMLCD 2, with each TFT 9 in the array being substantially the same according to preferred embodiments. Each linear TFT 9 has a channel length "L" defined by the gap 27 between source electrode 15 and drain electrode 13. Source electrode 15 is connected to pixel electrode 3 by way of via or contact hole 35 so as to permit TFT 9 to act as a switching element and selectively energize a corresponding pixel in AMLCD 2 in order to provide image data to a viewer, or to address the memory cell of an X-ray imager. An array of these TFTs 9 is provided as illustrated in FIG. 1.

In X-ray imager embodiments, electrode 3 (e.g. of ITO) in FIG. 4 overlaps the TFT channel 27, as shown in FIG. 4 while in certain LCD embodiments electrode 3 overlaps the source 15 but not channel 27. In X-ray imager embodiments, a separate collecting capacitor may be provided as illustrated and discussed in U.S. Pat. Nos. 5,498,880 and 5,396,072, or a separate photosensitive element as in U.S. Pat. No. 5,619,033, the disclosures of which are hereby incorporated herein by reference. X-ray imagers according to this invention function as discussed in any of the aforesaid three U.S. patents.

Still referring to FIG. 4, each TFT 9 structure in both LCD and X-ray imager embodiments includes substantially transparent substrate 19 (e.g. made of glass), metal gate electrode 17, gate insulating layer or film 21, semiconductor layer 23 (e.g. intrinsic amorphous silicon), doped semiconductor contact layer 25, drain electrode 13, source electrode 15, substantially transparent intermediate insulating layer 32, substantially transparent second insulation layer 33, and a corresponding substantially transparent electrode 3. Overlapping the TFT and/or address line(s). TFT channel 27 of length "L" is defined between source 15 and drain 13.

As shown in FIG. 4, drain electrode 13 is made up of a drain metal layer (e.g. Mo) which is deposited on substrate 19 over top of doped contact layer 25. Contact is film or layer 25 may be, for example, amorphous silicon doped with an impurity such as phosphorous (i.e. n+a-Si) and is sandwiched between semiconductor layer 23 and drain metal layer 13. Source electrode 15 includes doped semiconductor contact layer 25 and source metal layer 15. Metal layers 13 and 15 may be of the same metal and deposited and patterned together according to certain embodiments of this invention. Alternatively, layer 13 may be deposited and patterned separately from layer 15 so that drain metal layer is of one metal (e.g. Mo) and the source metal layer is of another (e.g. Cr).

Substantially transparent layers 32 and 33 make up the dual-layered insulator according to this invention, where layer 32 is provided to improve TFT performance by preventing direct contact between organic or acrylic layer 33 and intrinsic a-Si layer 23. Thus, insulating layer 33 with a low dielectric constant allows crosstalk to be reduced so as to improve TFT and image performance while intermediate insulating layer 32 (e.g. silicon nitride, silicon oxide, or $SiO_xN_y$) eliminates potential TFT off current and large subthreshold slope, and improves TFT thermal and electrical stability.

Substantially transparent insulating layer 33 having a dielectric constant less than about 5.0 (preferably less than about 4.0 and most preferably less than about 3.0) is deposited as a sheet on substrate 19 so as to cover inorganic intermediate insulating layer 32, TFTs 9, and address lines 5 and 7. organic layer 33 is formed of a photo-imageable material such as Fuji Clear™ or a photo-imageable type of BCB. Substantially transparent layer 33 may also be formed of a non-photo-imageable type of BCB. Insulating layers 32 and 33 are continuous in the viewing area of the display or imager except for vias or contact holes 35 (and sometimes 36) formed therein to allow electrodes 3 to contact corresponding TFT source electrodes 15 and the storage capacitor electrodes respectively.

Layer 33 has a dielectric constant $\epsilon$ less than or equal to about 5.0 according to certain embodiments of this invention, preferably less than about 4.0, and more preferably less than about 3.0. In certain preferred embodiments, layer 33 has a dielectric constant of about 2.7 and is made of a photo-imageable type of Benzocyclobutene (BCB), an organic material available from Dow Chemical, for the purpose of reducing capacitive crosstalk (or capacitive coupling) between pixel electrodes 3 and the address lines in overlap areas 18. Layer 33 has a low dielectric constant and/or a relatively large thickness for the specific purpose of reducing $C_{PL}$ in overlap areas 18.

Alternatively, layer 33 may be of a photo-imageable material known as Fuji Clear™, which is an organic mixture including 2-Ethoxyethyl acetate (55–70%), methacrylate derivative copolymer (10–20%), and polyfunctional acrylate (10–20%). Fuji Clear™ has a dielectric constant of about 3.5. Other materials which may be used as layer 33 includes PFCB available from Dow, and known polyimides.

Inorganic layer 32 may be of any material which either eliminates or lessens the degree of TFT threshold voltage and sub-threshold swings, by preventing direct contact between semiconductor material of the TFT and organic or acrylic insulating layer 33.

Insulating layer 32 is formed on the TFT array over substantially the entire viewing area. Optionally, layer 32 may be formed only over the TFTs. Following the deposition of insulation layer 33 over top of layer 32, TFTs 9, and address lines 5 and 7, vias 35 are formed in insulation layer 33 by way of photo-imaging. Layer 33 acts as a negative resist so that UV exposed areas remain on the substrate and areas of layer 33 unexposed to UV during photo-imaging are removed during developing. Thereafter, using patterned layer 33 as an etch mask, vias 35 are etched in intermediate layer 32 so as to expose the source electrodes 15. For $SiN_X$, $SiO_X$, and/or $SiO_XN_Y$ film, conventional reactive ion etching (RIE) utilizing F or Cl plasma, can be used. Following the forming of vias 35 in layers 32 and 33, substantially transparent electrodes 3 (e.g. made of indium-tin-oxide or ITO) are deposited and patterned over top of layers 32 and 33 on substrate 19 so that each electrode 3 contacts a corresponding source electrode 15 of a corresponding TFT 9 through a via 35 as illustrated in FIG. 4.

In certain embodiments, auxiliary vias 36 (see FIG. 1) are formed in layers 32 and 33 at the same time as vias 35 so that electrodes 3 can contact storage capacitor electrodes 12 via electrode extensions 38. Peripheral lead areas and seal areas are also removed by photo-imaging.

Insulating layers 32 and 33 are deposited on substrate 19 over the address lines, storage capacitors, and TFTs to a thickness "d" of at least about 0.5 μm in overlap areas 18. In preferred embodiments, the total thickness "d" of the insulating layers 32 and 33 is from about 1 to 2.8 μm, with layer 32 being from about 100–1,000 Å thick (preferably from about 500–1,000 Å thick) and layer 33 being from about 0.90–2.7 μm thick (preferably from about 1.5–2.5 μm thick).

Another advantage of layer 33 is that liquid crystal layer disclinations induced at pixel electrode 3 edges by the topography of TFTs 9, storage capacitors, and address lines are substantially eliminated by planarization (i.e. few, if any, hills and valleys are present in the top surface of layer 33). Thus, the thickness of the LC layer is substantially maintained and display functionality is improved because electrodes 3 are substantially flat because of the substantial planarization of the surface of layer 33 adjacent the pixel electrodes 3.

Because of the low dielectric constant $\epsilon$ and/or relatively high thickness "d" of layer 33, the capacitive crosstalk problems of the prior art resulting from overly high $C_{PL}$ values are substantially reduced in areas 18 where pixel electrodes 3 overlap address lines 5 and/or 7. Because layer 33 is disposed between pixel electrodes 3 and the overlapped address lines, the capacitive crosstalk problems of the prior art are substantially reduced or eliminated and increased pixel openings are achievable without sacrificing display performance (pixel isolation).

Pixel opening sizes or the pixel aperture ratio of AMLCD 2 (or of an imager) is at least about 65% (preferably from about 68% to 80%) according to certain embodiments of this invention when the pixel pitch is about 150 μm. This will, of course, vary depending upon the pixel pitch of the X-ray imager or display (pitches of from about 40–500 μm may be used). Electrodes 3 overlap address lines 5 and 7 along the edges thereof as shown in FIG. 1 by an amount up to about 3 μm. In certain preferred embodiments of this invention, the overlap 18 of electrodes 3 over the edges of address lines 5 and 7 is designed to be from about 2 to 3 μm, is with the end result after overetching being at least about 0.5 μm. According to certain other embodiments of this invention, the amount of overlap may be designed to be from about 2–3 μm, with the resulting post-processing overlap being from about 0 to 2 μm. The overlap amount may be adjusted in accordance with different LCD or imager applications and pitch sizes as will be appreciated by those of skill in the art.

In certain situations, after etching and processing, electrodes 3 may not overlap the address lines at all according to certain embodiments of this invention, although some overlap 18 is preferred. When no overlap occurs, the parasitic capacitance $C_{PL}$ between the address lines and the adjacent electrode 3 is still minimized or reduced due to insulating layer 33.

The TFT structures according to this invention have $C_{PL}$ line-pixel capacitance values, given the stated overlap and thickness parameters, as in U.S. Pat. No. 5,641,974. Thus, $C_{PL}$ in areas of overlap of address lines is preferably less than about 12.0 fF, and more preferably less than about 9.0 fF.

Referring now to FIGS. 4–7, it will be described how an AMLCD 2 or an X-ray imager including the array of TFTs and corresponding address lines is made according to an embodiment of this invention. Firstly, referring to FIG. 5, substantially transparent substrate 19 is provided. Next, a gate metal layer or sheet (which results in gate electrodes 17 and in some embodiments lines 7) is deposited on the top surface (surface to be closest to the LC layer LCDs or the image to be received in imagers) of substrate 19 to a thickness of from about 1,000–5,000 Å, most preferably to a thickness of about 2,500 Å. The gate metal sheet is deposited by way of sputtering or vapor deposition. The gate metal may be of tantalum (Ta) according to certain embodiments of this invention. Insulating substrate 19 may be of glass, quartz, sapphire, or the like.

The structure including substrate 19 and the deposited gate metal is then patterned by photolithography to the desired gate electrode 17 and gate address line 7 configuration. The upper surface of the gate metal is exposed in a window where the photoresist has not been retained. The gate metal (e.g. Ta) layer is then dry etched (preferably using reactive ion etching) in order to pattern the gate metal layer in accordance with the retained photoresist pattern. To do this, the structure is mounted in a known reactive ion etching (RIE) apparatus which is then purged and evacuated in accordance with known RIE procedures and etchants. This etching of the gate metal layer is preferably carried out until the gate metal is removed in center areas of the windows and is then permitted to proceed for an additional time (e.g. 20 to 40 seconds) of overetching to ensure that the gate metal is entirely removed from within the windows. The result is gate address lines 7 and gate electrodes 17 being left on substrate 19.

Figure 5:
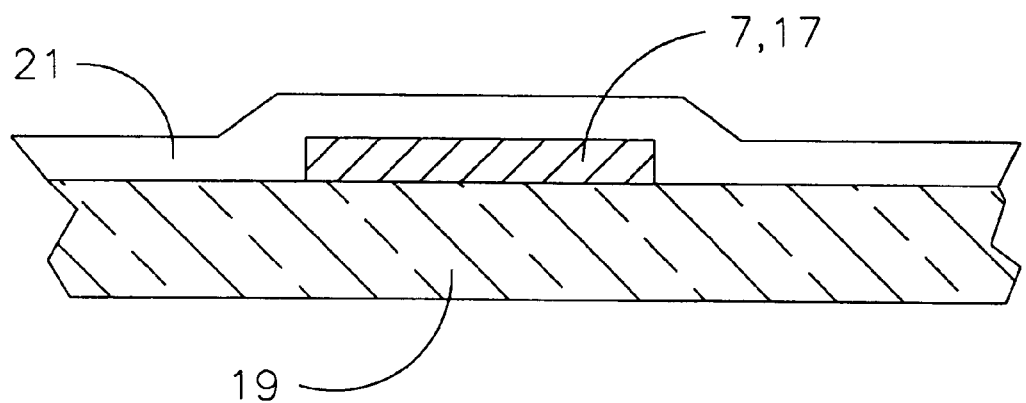
FIGS. 5–7 are side elevational cross-sectional views illustrating how a TFT in an array according to this invention is manufactured.

After gate address lines 7 are deposited and patterned on top of substrate 19 in the above-described manner, substantially transparent gate insulating or dielectric layer 21 is deposited over substantially the entire substrate 19, preferably by plasma enhanced chemical vapor deposition (CVD) or some other process known to produce a high integrity dielectric. The resulting structure is shown in FIG. 5. Gate insulating layer 21 is preferably silicon nitride (e.g. $Si_3N_4$) but may also be silicon dioxide or other known dielectrics. Silicon Nitride has a dielectric constant of about 6.4. Gate insulating layer 21 is deposited to a thickness of from about 2,000–3,000 Å (preferably either about 2,000 Å or 3,000 Å) according to certain embodiments.

It is noted that after anodization (which is optional), gate Ta layer 17 which was deposited as the gate electrode and gate line layer (when originally about 2,500 Å thick) is about 1,800 Å thick and a newly created TaO layer is about 1,600 Å. Anodization takes place after the gate line patterning and before further processing. Thus, gate insulating layer 21 over gate lines 7 and electrodes 17 is made up of both the anodization created TaO layer and the silicon nitride layer. Other metals from which gate electrode 17 and address line layer 7 may be made include Cr, Al, titanium, tungsten, copper, and combinations thereof.

Figure 6:
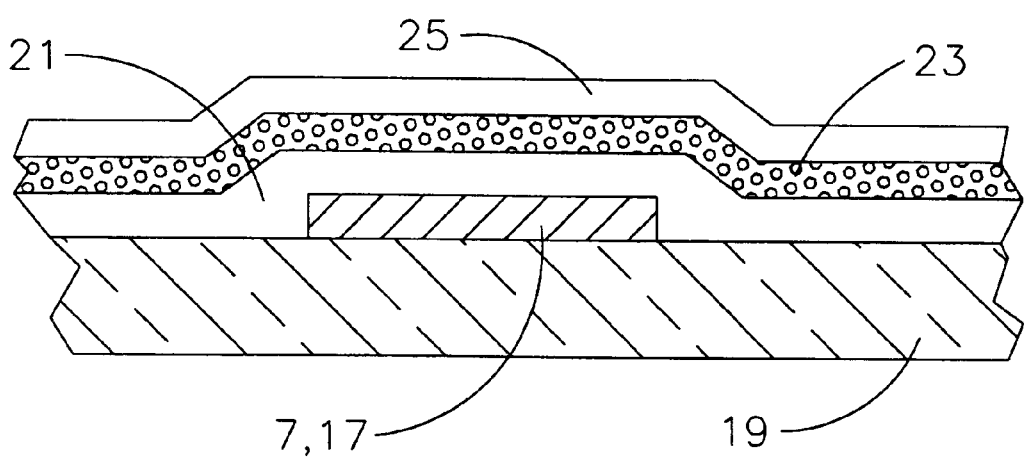

Next, referring to FIG. 6, after gate insulating layer 21 has been deposited (FIG. 5), semiconductor (e.g. intrinsic a-Si) layer 23 is deposited on top of gate insulating layer 21 to a thickness of about 2,000 Å. Semiconductor layer 23 may be from about 1,000 Å to 4,000 Å thick in certain embodiments of this invention. Then, doped (typically phosphorous doped, that is n+) amorphous silicon contact layer 25 is deposited over intrinsic a-Si layer 23 in a known manner to a thickness of, for example, about 500 Å. Doped contact layer 25 may be from about 200 Å to 1,000 Å thick according to certain embodiments of this invention. The result is the FIG. 6 structure.

Gate insulating layer 21, semiconductor layer 23 and semiconductor contact layer 25 may all be deposited on substrate 19 in the same deposition chamber without breaking the vacuum according to certain embodiments of this invention. When this is done, the plasma discharge in the deposition chamber is stopped after the completion of the deposition of a particular layer (e.g. insulating layer 21) until the proper gas composition for deposition of the next layer (e.g. semiconductor layer 23) is established. Subsequently, the plasma discharge is re-established to deposit the next layer (e.g. semiconductor layer 23). Alternatively, layers 21, 23, and 25 may be deposited in different chambers by any known method.

Following the formation of the FIG. 6 structure, the TFT islands or areas may be formed by way of etching of the semiconductor layers across the array, for example, so that the TFT metal layers can be deposited thereon. optionally, one of the TFT metal source/drain layers may be deposited before forming the TFT island.

According to preferred embodiments, following the formation of the TFT island from the FIG. 6 structure, a source-drain metal sheet or layer (which results in drain metal layer 13 and source metal layer 15) is deposited on substrate 19 over top of semiconductor layer 23 and contact layer 25. This source-drain metal layer may be chromium (Cr) or molybdenum (Mo) according to certain embodiments of this invention. When chromium, the layer is deposited to a thickness of about 500–2,000 Å, preferably about 1,000 Å according to certain embodiments. When molybdenum, the layer is deposited to a thickness of from about 2,000 to 7,000 Å, preferably about 5,000 Å. The deposited source drain metal layer sheet is then patterned (masked and etched) to form the source 15, drain 13, and in some embodiments the storage capacitor electrodes.

Alternatively, a first metal layer may be deposited and patterned to form a drain electrode portion 13, and a second metal layer may be deposited and patterned to form a source electrode portion 15. Thus, for example, source metal layer 15 may be chromium (Cr) while drain metal 13 and storage capacitor electrode layer is Mo according to certain embodiments of this invention. Other metals which may be used for the source and drain metals include titanium, Al, tungsten, tantalum, copper, or the like.

After patterning of drain and source portions, contact layer 25 is etched in the TFT channel 27 area and inevitably a bit of semiconductor layer 23 is etched along with it. The result is TFT 9 with channel 27 as shown in FIGS. 4 and 7.

After TFTs 9 are formed across the viewing area of the display or imager, substantially transparent dielectric intermediate protective layer 32 is deposited to a thickness of from about 100–1,000 Å (preferably from about 500 Å to 1,000 Å) on substrate 19 via CVD or the like. This substantially transparent intermediate protective layer 32 preferably includes or is of silicon nitride, but may be of other known passivation materials such as $SiO_2$, $SiO_xN_y$, or the like. Substantially transparent organic polymer insulating layer 33 is then deposited onto substantially the entire substrate 19 over top of intermediate layer 32 by way of spin-coating according to certain embodiments of this invention. Layer 33 may be of either photo-imageable BCB or acrylic Fuji Clear™ according to certain embodiments. As layer 33 is much thicker than layer 32, Insulating layer 33 fills recesses generated upon formation of TFTs 9 and flattens the surface above substrate 19 at least about 60% planarization according to certain embodiments.

Photo-imageable insulating layer 33 acts as a negative resist layer according to certain embodiments of this invention so that no additional photoresist is needed to form vias in layer 33. In order to form the vias, layer 33 is irradiated by ultraviolet (UV) rays (e.g. i rays of 365 nm), with UV irradiated areas of layer 33 to remain and non-exposed or non-radiated areas of layer 33 to be removed in developing. A mask may be used. Thus, the areas of the negative resist 33 corresponding to vias 35 (and in some embodiments 36) are not exposed to the UV radiation, while the rest of the layer 33 across the substrate is exposed to UV.

Figure 7:
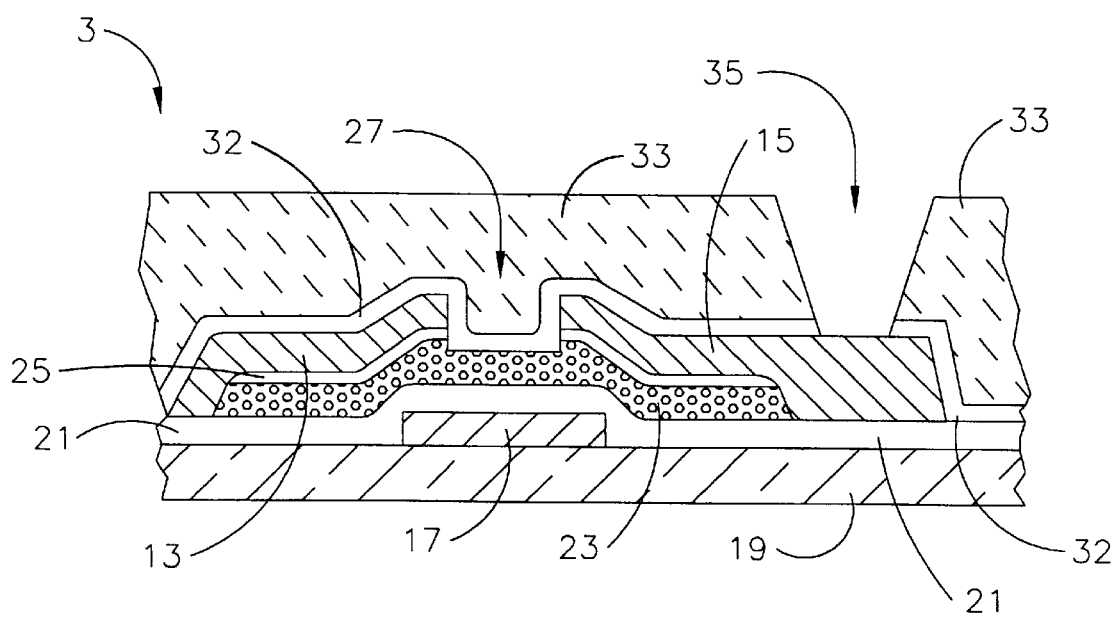

Referring to FIG. 7, following exposure of layer 33 (except in the via or contact hole areas), layer 33 is developed by using a known developing solution at a known concentration. In the developing stage, the areas of layer 33 corresponding to the vias are removed (i.e. dissolved) so as to form the vias in the insulating layer 33. After developing, the resist layer 33 is cured or subjected to postbaking (e.g. about 240 degrees C. for about one hour) to eliminate the solvent so that the layer 33 with the vias therein is resinified. Thus, no dry or wet etching is needed to form the vias (e.g. 35) in layer 33. According to alternative embodiments, layer 33 may be a positive resist as opposed to a negative resist. The resulting structure is shown in FIG. 7.

After layer 33 is patterned (see FIG. 7), vias 35 are formed in intermediate layer 32 by RIE or the like, using the patterned layer 33 as an etch mask. Conventional reactive plasma $CHF_3/O_2$; $CF_4/O_2$; $SF_6/O_2$; $Cl_2$; and/or $NF_3$, can be used to etch $SiO_X$, $SiN_X$, and/or $SiO_XN_Y$ films.

Vias or apertures 35 are thus formed in insulation layers 32 and 33 over top of (or adjacent) each source metal electrode 15 so as to permit electrodes 3 to electrically contact corresponding source electrodes 15 through vias 35. Layers 32 and 33 remains across the rest of the substrate or array except for the storage capacitor vias (if needed) and certain edge areas where contacts must be made or glueing done.

An alternative way to form layer 32 and/or layer 33 is to deposit layer 32 first, and then pattern layer 32 with photo-resist and etch layer 32. After layer 32 is finished, layer 33 is then deposited and patterned. This approach will add an additional photo step, but is feasible.

After the vias are formed in layers 32 and 33, a substantially transparent conducting layer (e.g. ITO) which results in electrodes 3 is deposited and patterned (photomasked and etched) on substrate 19 over top of layer 33. After patterning (e.g. mask and etching) of this substantially transparent conducting layer, electrodes 3 are left as shown in FIGS. 1 and 4. As a result of vias 35 formed in layer 33, each electrode 3 contacts a TFT source electrode 15 as shown in FIG. 4. The result is the active plate of either an LCD or an X-ray imager, including an array of TFTs. The electrode layer (when made of ITO) 3 is deposited to a thickness of from about 500 to 3,000 Å (preferably about 1,400 Å) according to certain embodiments of this invention. Other known materials may be used as electrode layer 3. It is noted that in X-ray imager embodiments, electrodes 3 are preferably ITO, but need not be transparent.

Thus, with one extra deposition step and one extra RIE step, but possibly no extra photo step, this invention allows fabrication of TFTs with higher performance and reliability.

After formation of the active plate, in LCD embodiments, liquid crystal layer 45 is disposed and sealed between the active plate and the passive plate, the passive plate including substrate 51, polarizer 53, electrode 49, and orientation film 47 as shown in the '974 patent.

Electrodes 3 are patterned to a size so that they overlap both drain address lines 5 and gate address lines 7 along the edges thereof so as to result in an increased aperture ratio for the imager or the AMLCD 2. Optionally, electrodes 3 need not overlap all address lines, but may only partially overlap certain address lines 5 or 7 in certain embodiments. Electrodes also overlap the TFT channels in X-ray imager embodiments as shown in FIG. 4, but only partially overlap the TFTs and do not overlap the TFT channels in certain LCD embodiments.

The crosstalk problems of the prior art are substantially eliminated due to the presence of low dielectric layer 33 in overlap areas 18 between electrodes 3 and the address lines, and TFT performance is improved by the presence of intermediate layer 32.

Once given the above disclosure, many other features, modifications, and improvements will become apparent to the skilled artisan. Such other features, modifications, and improvements are, therefore, considered to be a part of this invention, the scope of which is to be determined by the following claims.

We claim:

1. An X-ray imager comprising:

a substrate;

an array of thin film transistors (TFTs) disposed on said substrate, said array of TFTs including a plurality of address lines connected to said TFTs;

an array of electrodes disposed on said first substrate, a plurality of said electrodes in said array of electrodes overlapping at least one of said address lines;

an organic photo-imageable insulating layer including acrylic, said organic photo-imageable insulating layer having a dielectric constant $\epsilon$ less than about 4.0 disposed on said substrate between said address lines and said electrodes at least in areas of overlap and areas adjacent source electrodes of the TFTs;

an intermediate protective insulating layer disposed between said TFTs and said photo-imageable insulating layer so as to prevent said organic photo-imageable insulating layer from directly contacting semiconductor material in channels of said TFTs thereby reducing potential shifts of threshold voltage and sub-threshold swings in said TFTs; and said photo-imageable insulating layer and said intermediate protective layer each having a plurality of contact vias defined therein, wherein said electrodes are in electrical communication with corresponding TFT source electrodes through said contact vias defined in said insulating layers.

2. The X-ray imager of claim 1, wherein said organic photo-imageable insulating layer is a negative resist layer.

3. The X-ray of claim 1, wherein said organic photo-imageable insulating layer includes one of 2-Ethoxyethyl acetate and Benzocyclobutene (BCB).

4. The X-ray imager of claim 1, wherein said organic photo-imageable insulating layer is substantially transparent to all visible wavelengths, and wherein the dielectric constant $\epsilon$ of said organic photo-imageable insulating layer is less than about 3.0.

5. The X-ray imager of claim 4, wherein said dielectric constant is about 2.7.

6. The X-ray imager of claim 1, wherein said organic photo-imageable insulating layer includes an organic mixture of 2-Ethoxyethyl acetate, methacrylate derivative copolymer, and polyfunctional acrylate.

7. The X-ray imager of claim 1, wherein said organic photo-imageable insulating layer is from about 0.9 to 2.7 $\mu$m thick, and said intermediate insulating layer is from about 100–1,000 Å thick.

8. The X-ray imager of claim 1, wherein the overlap distance or width is from about 0–2 $\mu$m in the overlap areas and the address line-electrode capacitance $C_{PL}$ is less than about 12.0 fF.

9. The X-ray imager of claim 8, wherein the capacitance $C_{PL}$ is less than about 9.0 fF.

10. A liquid crystal display comprising:

a first substrate;

a liquid crystal layer;

an array of substantially transparent pixel electrodes on said first substrate for permitting image data to be displayed to a viewer;

a plurality of gate lines and TFT gate electrodes;

a semiconductor layer patterned so as to remain in an array of TFT areas;

a source and a drain electrode in each TFT area on said first substrate, a TFT channel being defined between the corresponding source and drain electrodes of each TFT, thereby forming an array of TFTs on said first substrate;

drain lines connected to said drain electrodes;

wherein a plurality of said pixel electrodes overlap at least one of a gate line and a drain line thereby increasing the pixel aperture ratio of the display;

a substantially transparent organic polymer photo-imageable insulating layer having a dielectric constant $\epsilon$ less than about 4.0, said photo-imageable insulating layer being disposed on said first substrate between (i) at least one of said pixel electrodes, and (ii) at least one of said TFTs and at least one of the overlapped lines, so as to insulate the pixel electrodes from at least one of said overlapped lines and at least one of said TFTs; and an intermediate insulating layer disposed between said photo-imageable insulating layer and said TFTs so as to prevent the photo-imageable insulating layer from directly contacting TFT portions which said photo-imageable insulating layer overlap.

11. The LCD of claim 10, further comprising a plurality of contact vias photo-imaged in said photo-imageable insulating layer and etched in said intermediate insulating layer for allowing said pixel electrodes to contact said TFT source electrodes, and wherein said photo-imageable insulating layer is a resist and is organic.

12. The LCD of claim 10, further comprising a second group of contact vias photo-imaged in said photo-imageable insulating layer for allowing said pixel electrodes to contact corresponding storage capacitor electrodes.

13. The LCD of claim 10, wherein said photo-imageable insulating layer includes one of BCB and 2-Ethoxyethyl acetate.

14. The LCD of claim 10, wherein the gate and drain lines crisscross on said first substrate and wherein the pixel aperture ratio of the LCD is at least about 68%, and further comprising a second substrate wherein said liquid crystal layer is disposed between said first and second substrates; and wherein said intermediate insulating layer is from about 100–1,000 Å thick and is substantially transparent.

15. The LCD of claim 10, wherein the dielectric constant of said photo-imageable insulating layer is less than about 3.0.

16. A TFT array structure comprising:

an array of TFTs on a substrate, said TFTs being connected to a corresponding array of electrodes;

row and column address lines on said substrate for addressing said TFTs;

organic photo-imageable acrylic-inclusive insulating means having a dielectric constant less than about 4.0 disposed between (i) at least one of said electrodes; and (ii) at least one of said address lines, so as to reduce crosstalk; and an intermediate protective insulating layer disposed between said photo-imageable acrylic inclusive insulating means and said TFTs so as to prevent said insulating means from contacting semiconductor material of said TFTs.

17. The TFT array structure of claim 16, further including means for permitting said insulating means to be photo-imaged so as to form a plurality of contact vias therein so as to allow said electrodes to contact corresponding TFTs through said vias.

18. The TFT structure of claim 16, wherein said insulating means includes one of BCB and 2-Ethoxyethyl acetate.

19. The TFT structure of claim 16, wherein said insulating means and said intermediate insulating layer are substantially transparent to all visible wavelengths of light, and wherein said intermediate insulating layer includes at least one of silicon nitride, silicon oxide, and $SiO_XN_Y$.

\* \* \* \* \*